(12) United States Patent
Meng et al.

(10) Patent No.: US 10,979,825 B2
(45) Date of Patent: Apr. 13, 2021

(54) METHOD FOR MANUFACTURING MEMS MICROPHONE

(71) Applicant: AAC Acoustic Technologies (Shenzhen) Co., Ltd., Shenzhen (CN)

(72) Inventors: Zhenkui Meng, Shenzhen (CN); Zhengyan Liu, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 16/708,421

(22) Filed: Dec. 9, 2019

(65) Prior Publication Data

US 2020/0213775 A1   Jul. 2, 2020

(30) Foreign Application Priority Data

Dec. 31, 2018   (CN) .......................... 201811651271.8

(51) Int. Cl.
| | | |
|---|---|---|
| *H04R 9/08* | (2006.01) | |
| *H04R 11/04* | (2006.01) | |
| *H04R 17/02* | (2006.01) | |
| *H04R 19/04* | (2006.01) | |
| *H04R 21/02* | (2006.01) | |
| *H04R 19/00* | (2006.01) | |
| *B81B 3/00* | (2006.01) | |

(52) U.S. Cl.
CPC .......... *H04R 19/04* (2013.01); *B81B 3/0021* (2013.01); *H04R 19/005* (2013.01); *B81B 2201/0257* (2013.01); *B81B 2203/0127* (2013.01); *H04R 2201/003* (2013.01)

(58) Field of Classification Search
CPC ...... H04R 19/04; H04R 19/005; B81B 3/0021
See application file for complete search history.

(56) References Cited

U.S. PATENT DOCUMENTS

| | | | |
|---|---|---|---|
| 6,243,474 B1* | 6/2001 | Tai ...................... | H04R 19/016 29/594 |
| 2010/0158279 A1* | 6/2010 | Conti ..................... | H04R 7/24 381/174 |
| 2014/0001579 A1* | 1/2014 | Liu ...................... | B81B 3/0018 257/415 |
| 2014/0262838 A1* | 9/2014 | Fix ..................... | G01N 27/4072 205/793 |

(Continued)

FOREIGN PATENT DOCUMENTS

| | | |
|---|---|---|
| CN | 104254046 B2 | 12/2014 |
| CN | 109905833 A1 | 6/2019 |

OTHER PUBLICATIONS

PCT search report dated Jan. 8, 2020 by SIPO in related PCT Patent Application No. PCT/CN2019/113347 (4 Pages).

*Primary Examiner* — Simon King
(74) *Attorney, Agent, or Firm* — W&G Law Group LLP

(57) ABSTRACT

The invention provides a method for manufacturing a MEMS microphone, including the steps of: providing a base and preparing a first diaphragm on a first surface of the base; preparing a back plate on a surface of the first diaphragm opposite to the first surface; forming a first gap between the first diaphragm and the back plate; preparing a second diaphragm; forming a second gap between the second diaphragm and the back plate; preparing electrodes; forming a back cavity by etching the surface opposite to the first surface.

9 Claims, 9 Drawing Sheets

(56) References Cited

U.S. PATENT DOCUMENTS

| | | | |
|---|---|---|---|
| 2014/0264657 A1* | 9/2014 | Gogoi | H01L 27/16 257/416 |
| 2015/0165479 A1* | 6/2015 | Lasiter | B06B 1/0666 310/322 |
| 2018/0194615 A1* | 7/2018 | Nawaz | H04R 19/005 |

* cited by examiner

METHOD FOR MANUFACTURING MEMS MICROPHONE

FIELD OF THE PRESENT DISCLOSURE

The invention relates to a microphone technology, in particular to a method for manufacturing a MEMS (Micro-Electro-Mechanic Systems) microphone.

DESCRIPTION OF RELATED ART

With the development of wireless communication, the users have increasingly higher requirements for the call quality of mobile phones, and the design of microphone as a speech pickup device has a direct influence on the call quality of mobile phone.

As MEMS technology is featured by miniaturization, good integratability, high performance, low cost and the like, it has been appreciated by the industry, and MEMS microphone is widely used in current mobile phones; the common MEMS microphone is capacitive, i.e., including a vibrating diaphragm and a back plate which both constitutes a MEMS Acoustic sensing capacitance, and the MEMS acoustic sensing capacitance further outputs an acoustic signal to a processing chip for signal processing by connecting to the processing chip through a connecting plate. To further improve the performance of MEMS microphone, a dual-diaphragm MEMS microphone structure has been proposed in the prior art, i.e., two layers of vibrating diaphragm are used to constitute a capacitance structure with the back plate respectively. In the MEMS microphone based on silicon technology, the vibrating diaphragm and back plate of the above MEMS microphone are on the same silicon foundation and made with semiconductor making process, and it also comprises process steps such as forming an acoustic cavity, back cavity, acoustic hole, venting hole and connecting plate during manufacturing.

As each making process step of MEMS microphone is to make and form on the same silicon base, each process step can only be conducted after the previous process step is finished, thus causing a relatively low efficiency of manufacturing MEMS microphone.

Based on the above problems, it's necessary to provide a new method for manufacturing MEMS microphone dual-diaphragm structure to improve manufacturing efficiency.

BRIEF DESCRIPTION OF THE DRAWINGS

Many aspects of the exemplary embodiments can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

The present disclosure will hereinafter be described in detail with reference to several exemplary embodiments. To make the technical problems to be solved, technical solutions and beneficial effects of the present disclosure more apparent, the present disclosure is described in further detail together with the figure and the embodiments. It should be understood the specific embodiments described hereby is only to explain the disclosure, not intended to limit the disclosure.

Figure 1:
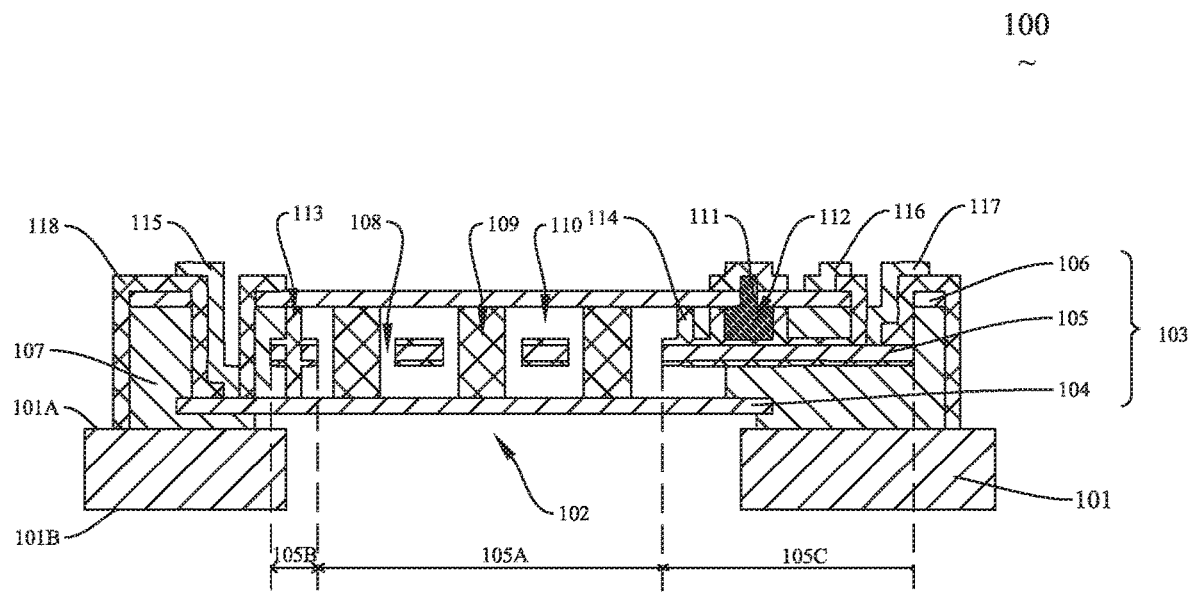
FIG. 1 is an illustration of a MEMS microphone in one embodiment of the invention.
Figure 2:
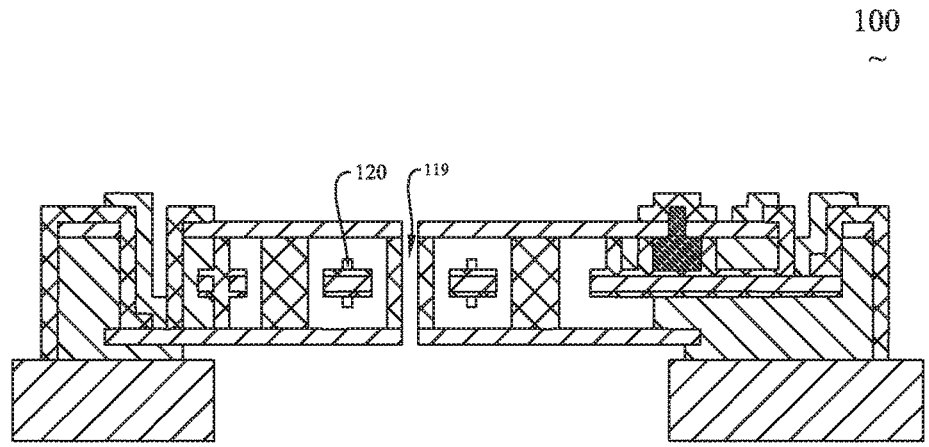
FIG. 2 is an illustration of the MEMS microphone in another embodiment of the invention.

With reference to FIGS. 1-2, a MEMS microphone structure 100 prepared by the manufacturing method of the invention comprises a base 101 and a capacitance system 103 placed on the base 101 and insulatively connected with the base 101.

The material of the base 101 is preferably semiconductor material, such as silicon, which has a back cavity 102, a first surface 101A and a second surface 101B opposite to the first surface, an insulation layer 107 provided on the first surface 101A of the base 101 with a back cavity 102 through the insulation layer 107, and the first and second surfaces of the base 101. Wherein the back cavity 102 can be formed through corrosion by a bulk-silicon process and dry method.

The capacitance system 103 comprises a back plate 105 and a first vibrating diaphragm 104 and a second vibrating diaphragm 106 provided opposite to the back plate 105 at the two upper and lower sides of the back plate 105 respectively, with an insulation layer 107 provided between all the first vibrating diaphragm 104 and the back plate 105, the second vibrating diaphragm 106 and the back plate 105, the vibrating diaphragm 104 and the base 101.

The central main body area 105A of the back plate 105 comprises an acoustic through hole 108 placed in interval, in the invention, the central main body area of the back plate 105 is, for example, the area where the corresponding back cavity 102 is located, and those beyond this area are edge areas of the back plate 105, those located at left and right sides are respectively the first edge area 105B, the second edge area 105C. The supporting part 109 penetrates through the acoustic through hole 108 to fixedly connect the first vibrating diaphragm 104 with the second vibrating diaphragm 106. Specifically, the supporting part 109 is abutted with a top surface of the first vibrating diaphragm 104 and a bottom surface of the second vibrating diaphragm 106 respectively.

The acoustic through hole 108 communicates with the area between the first vibrating diaphragm 104 and the second vibrating diaphragm 106 to form an internal cavity 110. When the MEMS microphone is powered on to work, the first vibrating diaphragm 104 and the back plate 105, the second vibrating diaphragm 106 and the back plate 105 will carry charges of opposite polarity to form capacitance, when the first vibrating diaphragm 104 and the second vibrating diaphragm 106 vibrate under the action of acoustic wave, the distance between the back plate 105 and the first vibrating diaphragm 104, between it and the second vibrating diaphragm 106 will change, so as to cause changes in capacitance of the capacitance system, which in turn converts the acoustic wave signal into an electrical signal to realize corresponding functions of the microphone.

In this embodiment, the first vibrating diaphragm 104 and the second vibrating diaphragm 106 are square, round or elliptical, at least one supporting part 109 is placed between the bottom surface of the first vibrating diaphragm 104 and the top surface of the second vibrating diaphragm 106.

The supporting part 109 is placed to penetrate through the acoustic through hole 108 of the back plate 105 to fixedly connect the first vibrating diaphragm 104 and the second vibrating diaphragm 106; i.e., the supporting part 109 has no contact with the back plate 105 and no influence from the back plate 105.

The supporting part 109 can be formed on the top surface of the first vibrating diaphragm 104 with all kinds of preparing technology, such as physical vapor deposition, electrochemical deposition, chemical vapor deposition and molecular beam epitaxy.

The supporting part 109 can be constituted by semiconductor material such as silicon or can comprise semiconductor material such as silicon. For example, germanium, SiGe, silicon carbide, gallium nitride, indium, indium gallium nitride, indium gallium arsenide, indium gallium zinc oxide or other element and/or compound semiconductor (e.g., III-V compound semiconductor or II-VI compound semiconductor such as gallium arsenide or indium phosphide, or ternary compound semiconductor or quaternary compound semiconductor). It can also be constituted by or comprise at least one of the followings: metal, dielectric material, piezoelectric material, piezoresistive material and ferroelectric material. It can also be made from dielectric material such as silicon nitride.

According to the embodiments, the supporting part 109 can be integrally molded with the first vibrating diaphragm 104 and the second vibrating diaphragm 106.

According to the second embodiment, the second vibrating diaphragm 106 of the invention comprises a releasing hole 111, and has the releasing hole 111 sealed with a dielectric material 112.

According to the embodiments, the first edge area 105B of the invention comprises a first barrier 113 releasing structure through the back plate, which isolates the acoustic through hole 108 and the insulation layer 107; the second edge area 105C comprises multiple second barrier releasing structures 114 placed in interval on the back plate 105, the barrier releasing structures isolate the acoustic through hole 108 and the insulation layer 107.

The releasing hole 111 is communicated with the internal cavity 110, so it allows to eliminate the sacrifice oxidation layer inside the internal cavity 110 by using a releasing solution such as BOE solution or HF vapor-phase etching technology, as the barrier releasing structures 113, 114 exist, the insulation layer 107 between the first vibrating diaphragm and the second vibrating diaphragm is preserved.

According to the embodiments, it also comprises the extraction electrodes of the first vibrating diaphragm 104, the second vibrating diaphragm 106 and the back plate 105, correspondingly a first electrode 115, a second electrode 116, a third electrode 117.

According to the embodiments, it also comprises a passivation protective layer of surface 118 which simultaneously has a function to achieve mutual insulation among the first electrode 115, the second electrode 116, the third electrode 117.

Refer to FIG. 2, the MEMS microphone further comprises a through hole 119 through the first vibrating diaphragm 104, the supporting part 109, the second vibrating diaphragm 106, the through hole 119, for example, is placed at the central position of the first vibrating diaphragm 104, the second vibrating diaphragm 106, communicating the back cavity 102 with the external environment, thus resulting in a consistent external pressure of the first vibrating diaphragm 104 and the second vibrating diaphragm 106.

Figure 3:
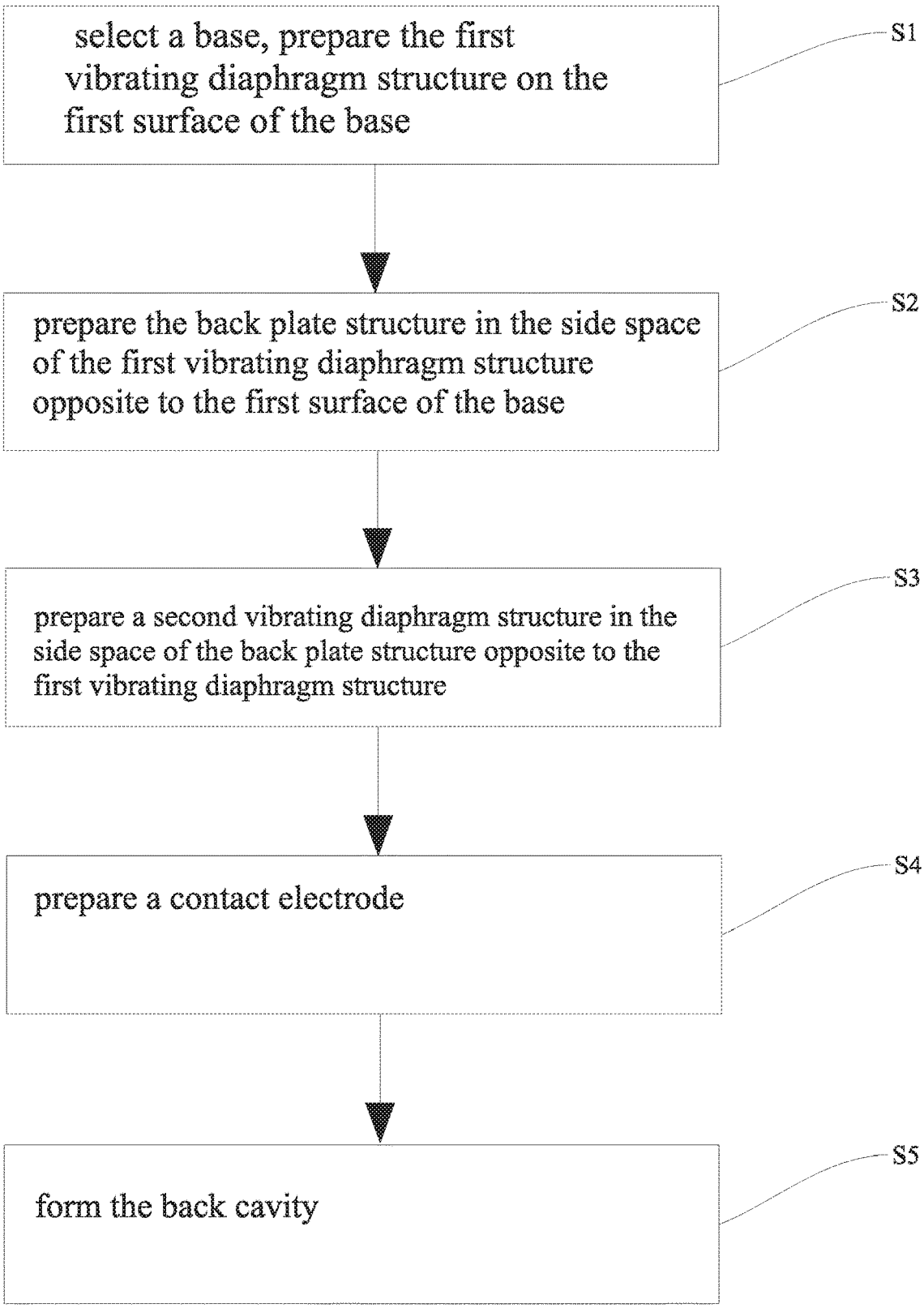
FIG. 3 is a flow chart of a method for manufacturing the MEMS microphone.
Figure 4A:
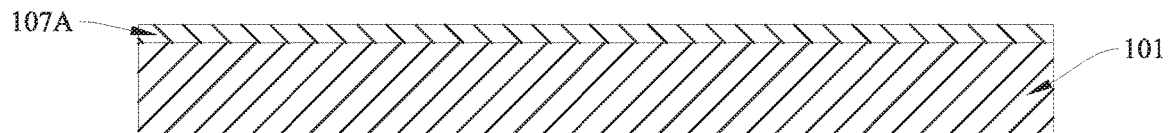
FIG. 4A-4X indicates the steps of the method for manufacturing the MEMS microphone.

Refer to FIG. 3a, a method for manufacturing the MEMS microphone mentioned above includes the steps of:

Step S1, select a base, prepare the first vibrating diaphragm structure on the first surface of the base:

Specifically, it comprises the following sub-steps:

S11, select the base 101, and deposit the first oxidation layer 107A on the first surface 101A of the base 101, as shown in FIG. 4A.

The base 101, for example, is a semiconductor silicon substrate, or a substrate of other semiconductor material such as: germanium, SiGe, silicon carbide, gallium nitride, indium, indium gallium nitride, indium gallium arsenide, indium gallium zinc oxide or other element and/or compound semiconductor (e.g., III-V compound conductor such as gallium arsenide or indium phosphide) germanium or and gallium nitride the like.

The first oxidation layer 107A, for example, is a silicon dioxide with a thickness of about 1 μm, formed by a regular process such as thermal oxidation and vapor deposition.

Figure 4B:
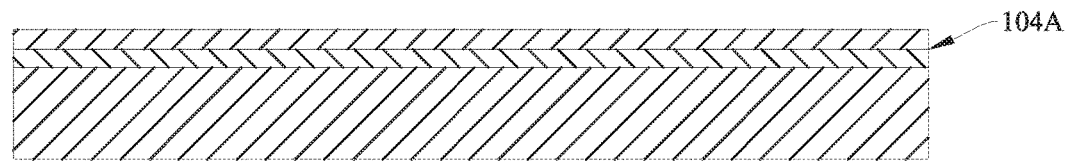
Figure 4C:

S12, deposit a first polycrystalline silicon layer 104A on the first oxidation layer 107A, the first polycrystalline silicon layer 104A, for example, has a thickness of about 1 μm, as shown in FIG. 4B;

S13, etch the first polycrystalline silicon 104A, according to the structural requirements for the first vibrating diaphragm 104, etch the first polycrystalline silicon layer 104A to form a basic structure of the first vibrating diaphragm 104, as shown in FIG. 4C.

Figure 4D:
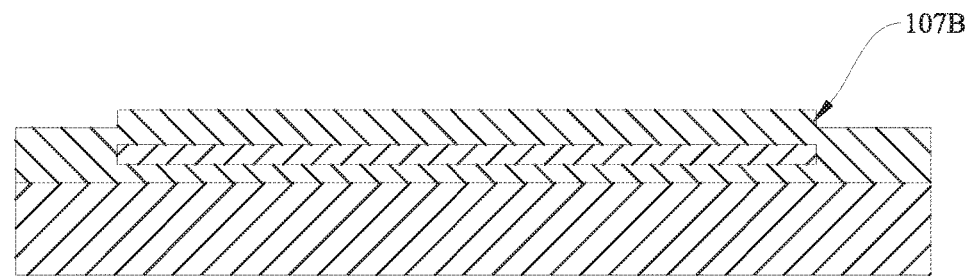
Figure 4E:
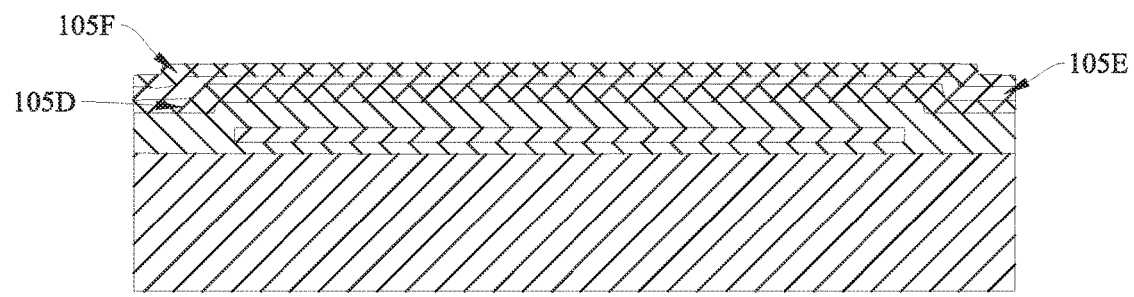

Step S2, prepare the back plate structure in the side space of the first vibrating diaphragm structure opposite to the first surface of the base:

Specifically, it comprises the following sub-steps:

S21, deposit the second oxidation layer 107B on the first vibrating diaphragm structure 104, the second oxidation layer 107B, for example, has a thickness of 0.5 μm, as shown in FIG. 4D; preferably, it also allows to etch the second oxidation layer 107B to form a bump prepared as a groove structure, so as to prevent the adhesion of the back plate 105 with the first vibrating diaphragm 104.

S22, deposit the material layer of back plate, in this embodiment, the back plate structure comprises a first nitride silicon layer 105D, a second polycrystalline silicon layer 105E, a second nitride silicon layer 105F overlapped from bottom to the top, wherein the first nitride silicon layer 105D covers the second oxidation layer 107A; the first nitride silicon layer 105D, the second nitride silicon layer 105F, for example, have a thickness of about 0.25 μm, the second polycrystalline silicon layer 105E in the middle, for example, has a thickness of about 0.5 μm.

Figure 4F:
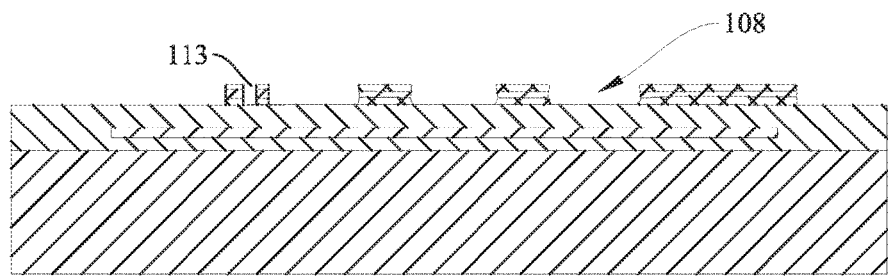

S23, etch the material layer of back plate to form an acoustic through hole 108 placed in interval, meanwhile form the first deposition groove for barrier dielectric releasing 113 in the first edge area 105B of the back plate; as shown in FIG. 4F;

Preferably, it also comprises a step of preparing a bump on the surface of the second nitride silicon layer 105F of the back plate.

Figure 4G:
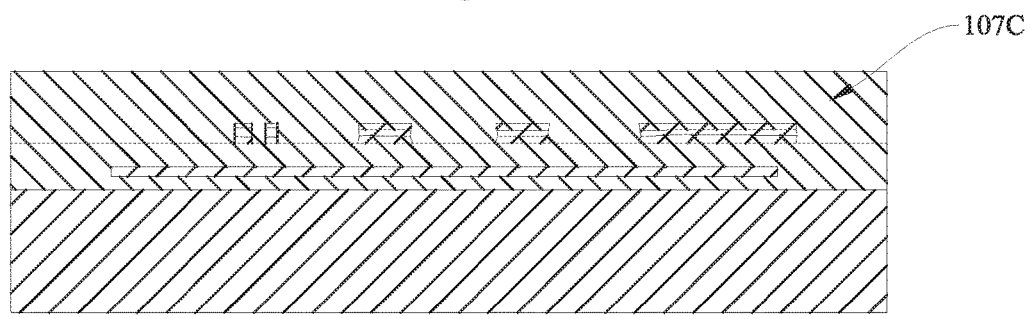

Step S3, prepare a second vibrating diaphragm structure in the side space of the back plate structure opposite to the first vibrating diaphragm structure;

Specifically, it comprises the following sub-steps:

S31, deposit the third oxidation layer 107C on the upper surface of the back plate; as shown in FIG. 4G, the planarization in this embodiment refers to, for example, using chemical mechanical polishing (CMP) process.

Figure 4H:
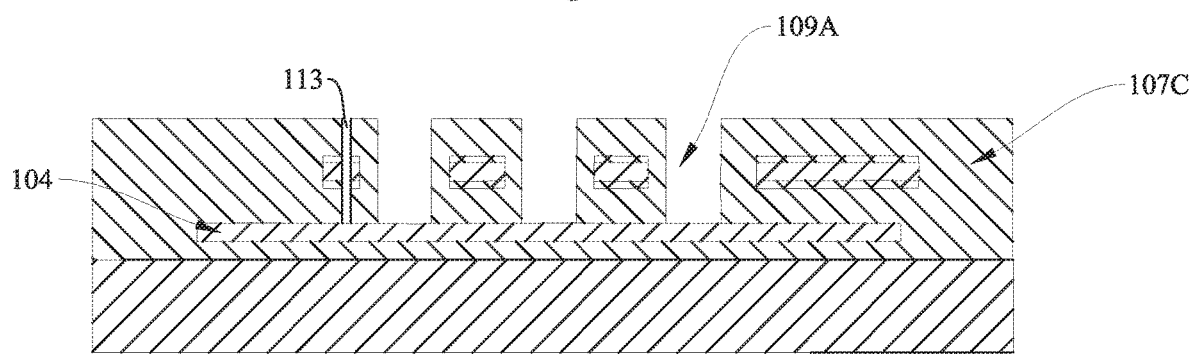
Figure 4I:
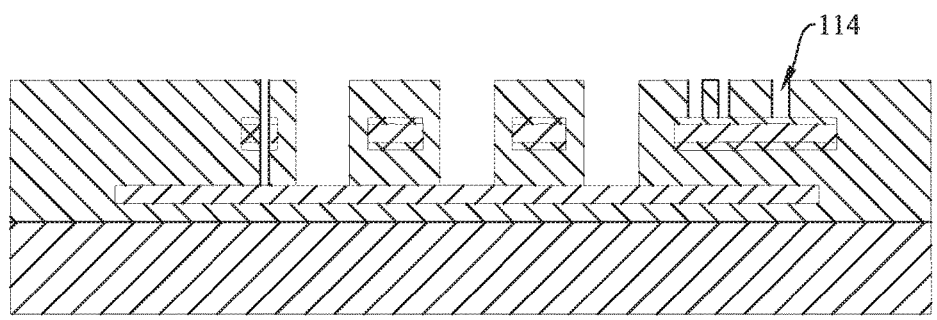
Figure 4J:
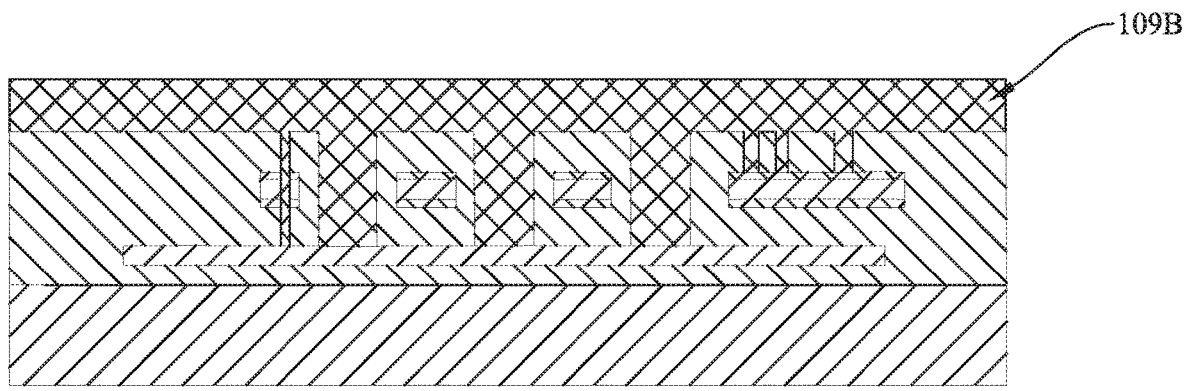
Figure 4K:
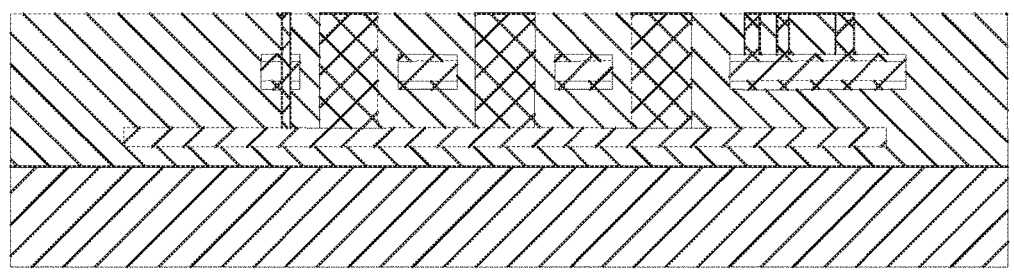
Figure 4L:
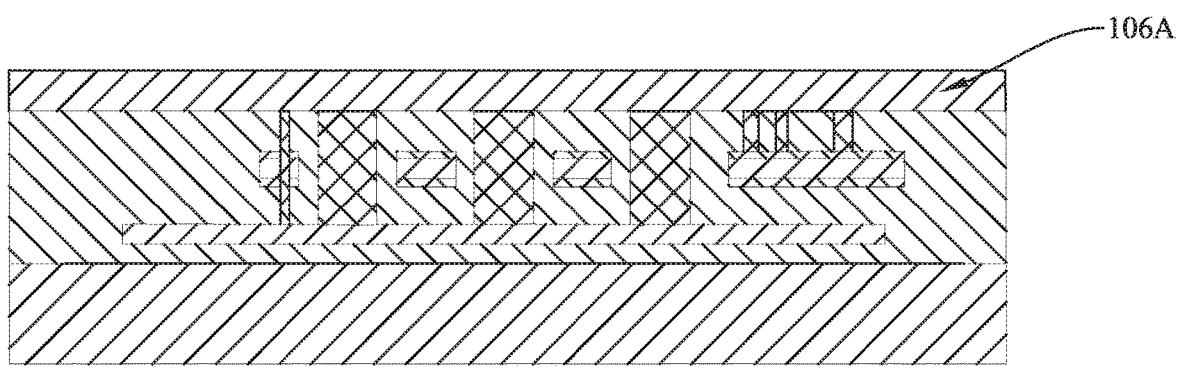
Figure 4M:
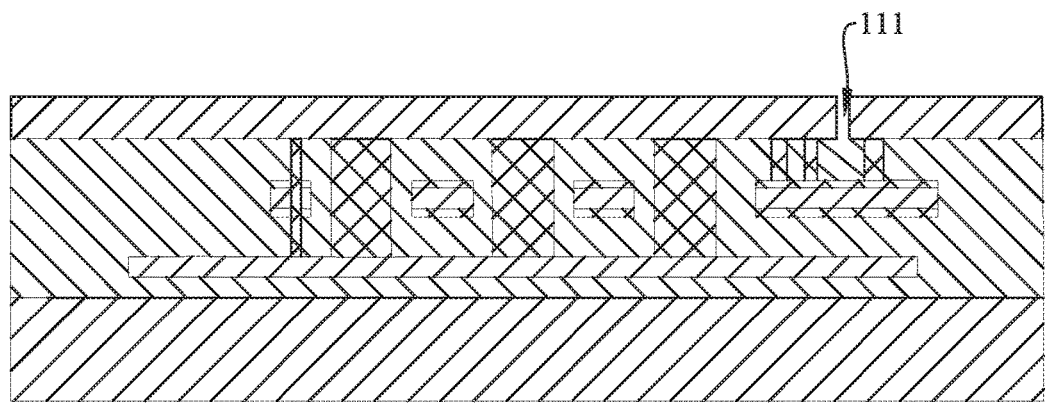

S32, etch the third oxidation layer 107C, form a deposition hole of supporting part 109A of the supporting part 109, the deposition hole 109A is in the acoustic through hole 108 of the back plate, exposed from the upper surface of the first vibrating diaphragm structure 104, meanwhile etch the oxidation layer in the first deposition groove for barrier dielectric releasing 113 to expose the upper surface of the first vibrating diaphragm structure 104, as shown in FIG. 4H;

S33, etch the third oxidation layer 107C above the second edge area 105B of the back plate structure, to form several second deposition grooves for barrier dielectric releasing 114, as shown in FIG. 4I;

S34, deposit the third nitride silicon layer 109B to fill up the deposition hole 109A, release the deposition grooves for barrier dielectric releasing 113/114; the thickness of the third nitride silicon layer 109B is, for example, enough to completely fill up the deposition hole 109A, about 4 micrometers, as shown in FIG. 4J;

S35, eliminate the third nitride silicon layer 109B beyond the deposition hole of supporting part 109A, for example, by using CMP process, as shown in FIG. 4K;

S36, deposit the third polycrystalline silicon film 106A, the thickness of the third polycrystalline silicon film 106A is 1 μm, as shown in FIG. 4L;

S37, etch the third polycrystalline silicon film 106A layer, to form a releasing hole 111; obviously, the position of the releasing hole is outside the supporting part 109, located between any two second layers for barrier dielectric releasing, as shown in FIG. 4M.

Figure 4N:
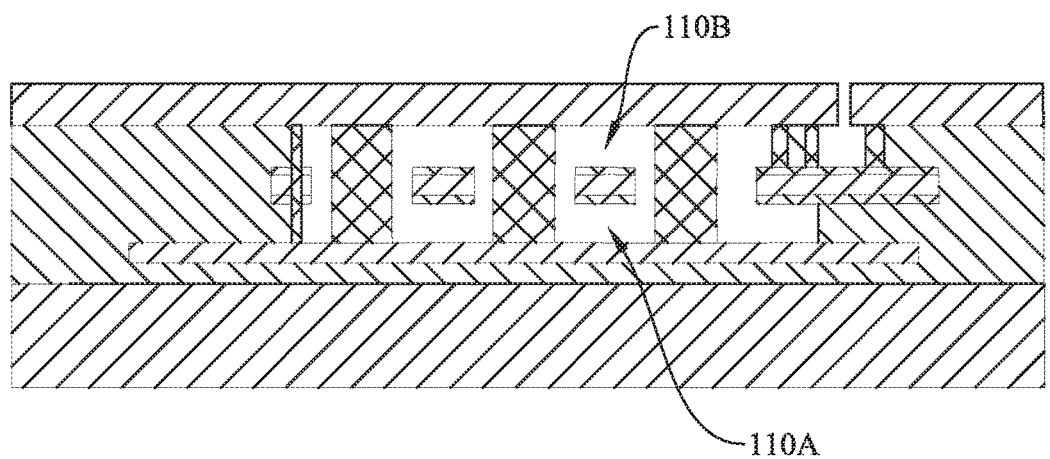

S38, the releasing hole 111 communicates with the sacrifice oxidation layer between the first layer for barrier dielectric releasing and the second layer for barrier dielectric releasing, then eliminate the oxidation layer located in the central main body area and between the first polycrystalline silicon layer 104A and the third polycrystalline silicon layer 106A through the releasing hole 111, release the oxidation layer, for example, by using BOE solution or HF vapor-phase etching technology, eliminate the oxidation layer under the third polycrystalline silicon until the first polycrystalline silicon layer is exposed; form a first isolation gap 110A between the first polycrystalline silicon and the back plate and a second isolation gap 110B between the third polycrystalline silicon and the back plate, as the size of the acoustic through hole 108 on the back plate is bigger than that of the supporting part 109, a communicated cavity 110 is formed between the first polycrystalline silicon layer 104A and the third polycrystalline silicon 106A, as shown in FIG. 4N.

Figure 4O:
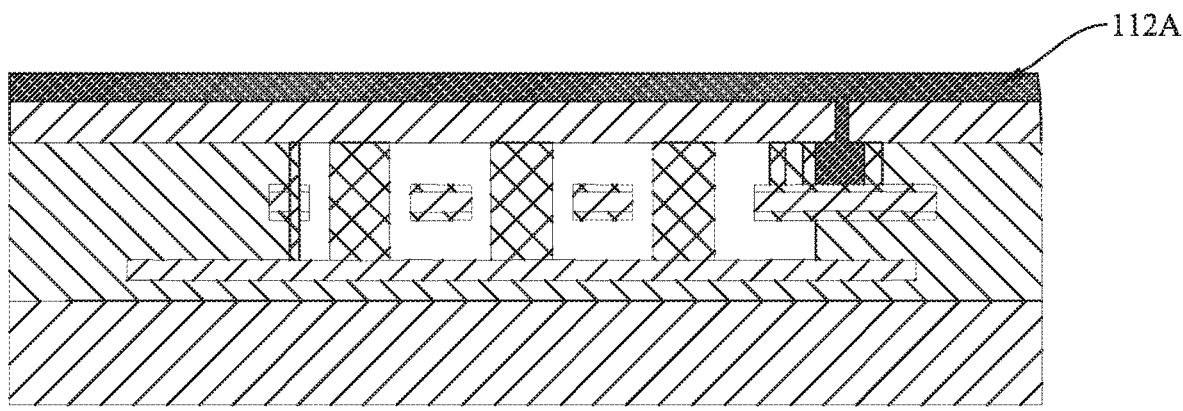
Figure 4P:
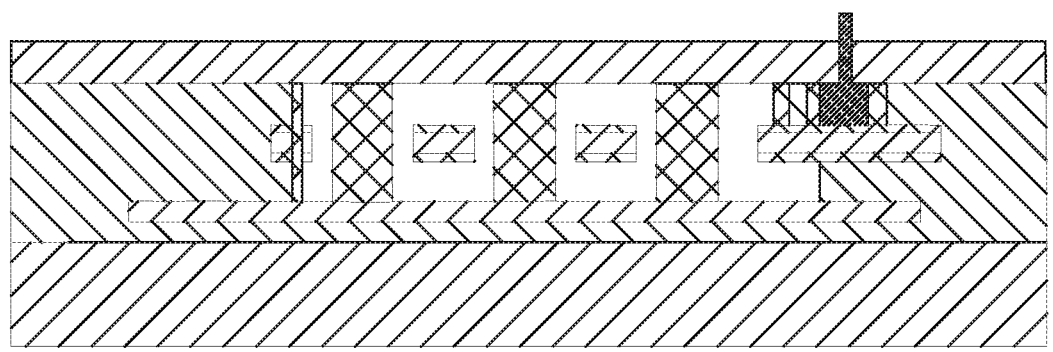

S38, seal the releasing hole 111, the sealing step forms a sealing layer 112A, for example, by using polymer, HDP oxidation layer or phosphosilicate glass (PSG) reflux process, as shown in FIG. 4O; and etch the sealing layer, eliminate the extra sealing layer 112A beyond the releasing hole area, and form the sealing medium 112 in the releasing hole 111, as shown in FIG. 4P.

Figure 4Q:
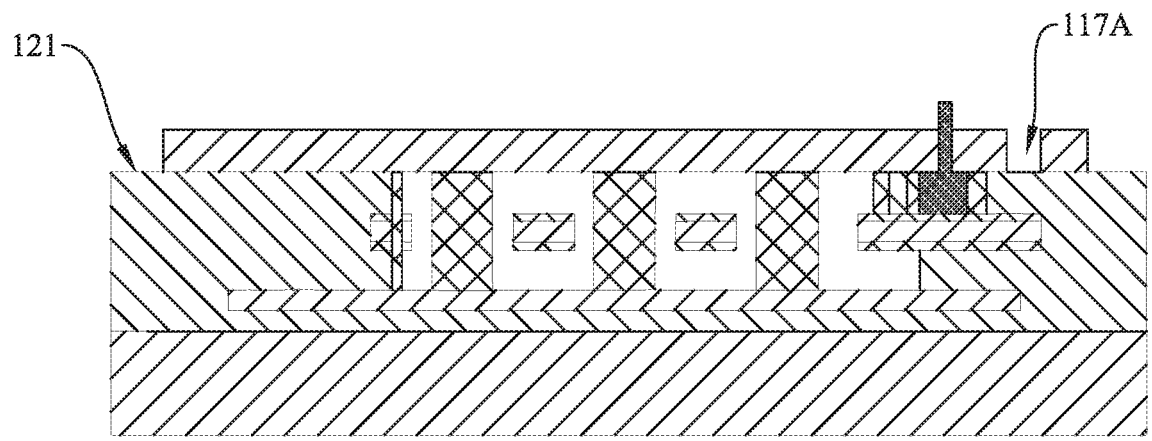

S39, etch the third polycrystalline silicon layer 106A, to form the second vibrating diaphragm structure 106, mainly aimed to expose the edge area 121 of the device to facilitate following dicing, meanwhile etch the contact hole area 117A of the back plate, as shown in FIG. 4Q;

Step S4, prepare a contact electrode

Figure 4R:
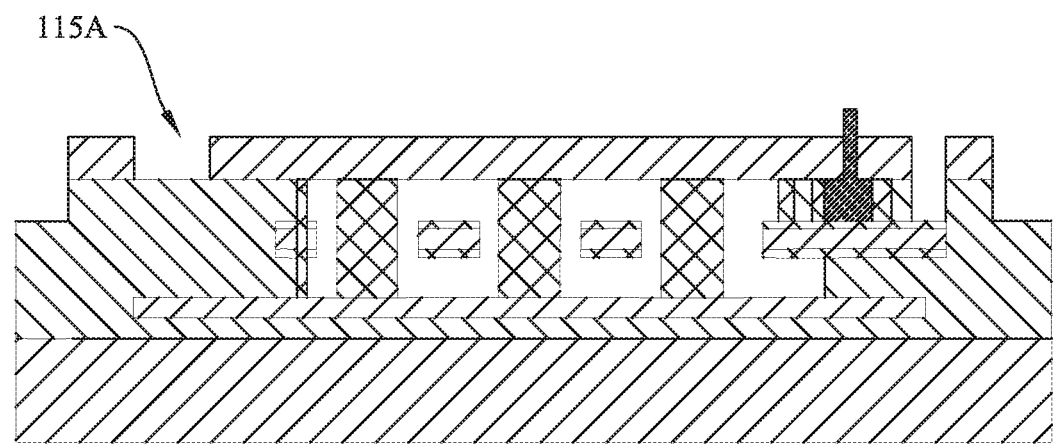
Figure 4S:
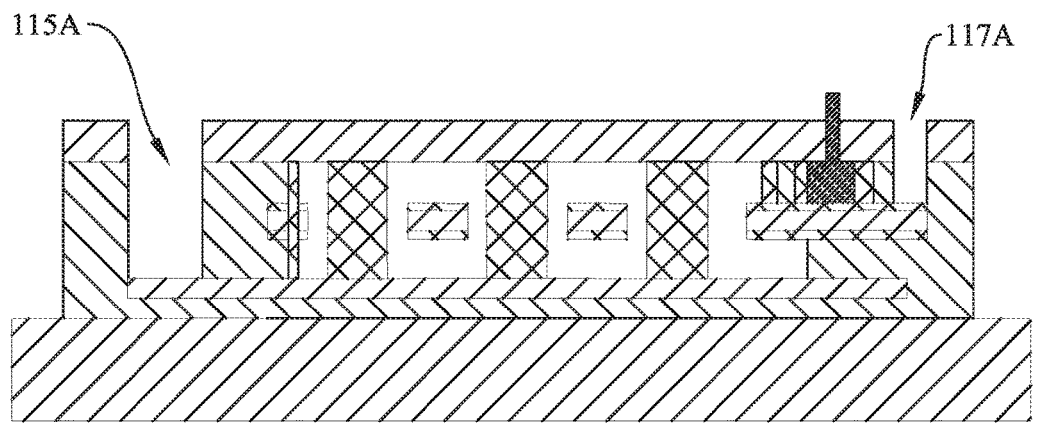
Figure 4T:
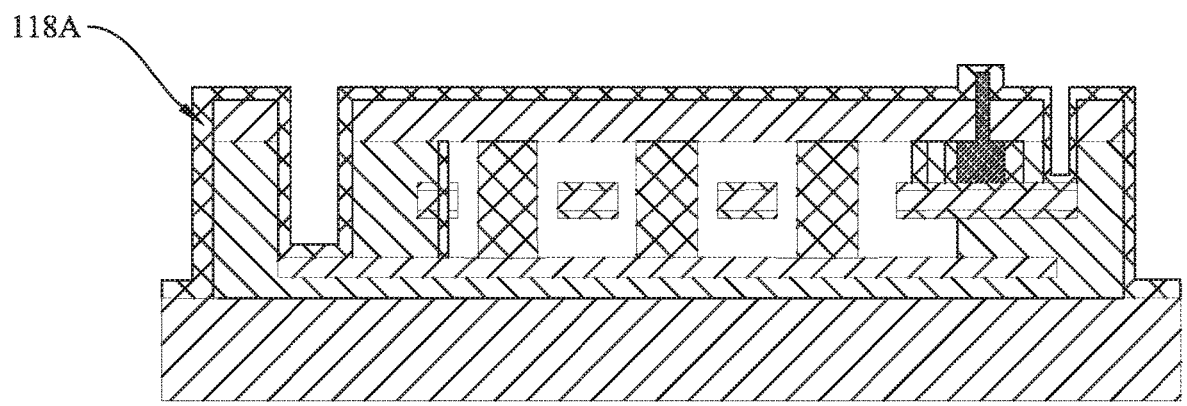
Figure 4U:
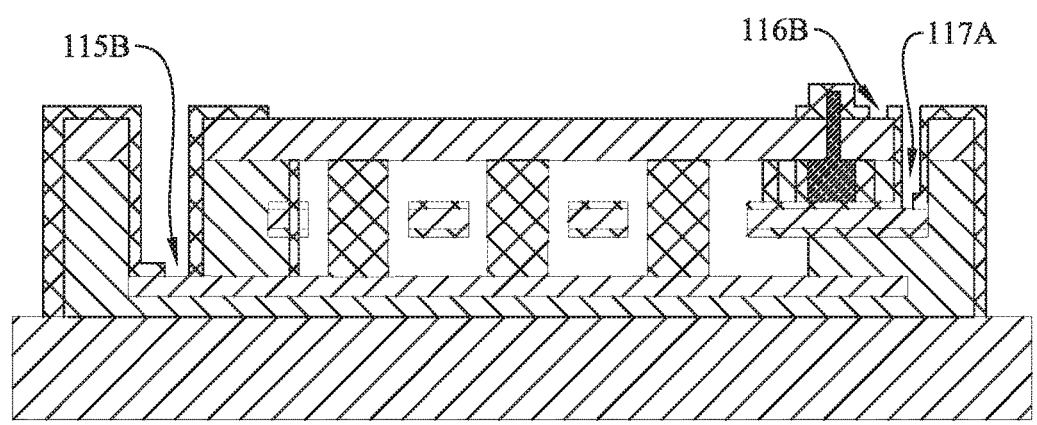
Figure 4V:
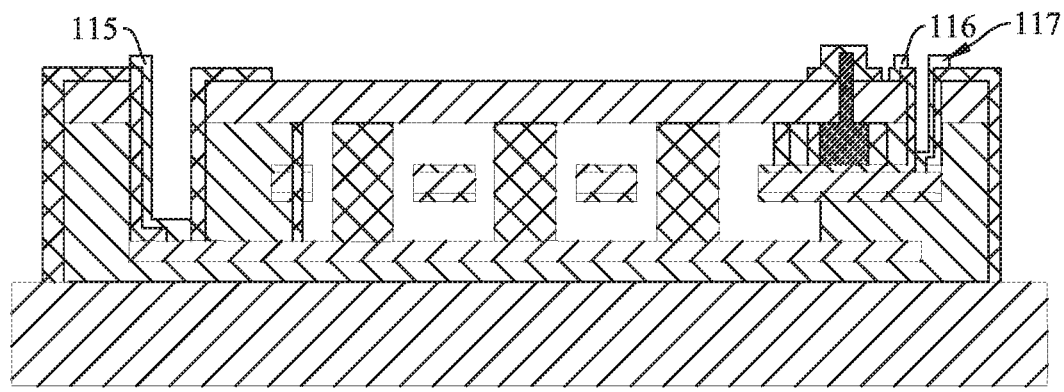

Specifically, it comprises the following sub-steps:

S41, etch the contact hole, the first step is to etch and expose the first contact hole 117A in the back plate area firstly, as shown in FIG. 4R, meanwhile etch the edge area 120 to the same depth; the second step is to etch and expose the second contact hole 115A of the first vibrating diaphragm 104, and the substrate silicon layer in the edge area of the MEMS microphone, as shown in FIG. 4S;

S42, deposit a passivation protective layer 118A on the entire device surface, the passivation layer is, for example, nitride silicon; as shown in FIG. 4T;

S43, etch the passivation layer to expose the contact areas 115B, 117A, 116B among the first polycrystalline layer, the second polycrystalline layer, the third polycrystalline layer, furthermore, if TBD is an oxide, it requires to reserve the passivation layer on the TBD layer; as shown in FIG. 4U;

S44, deposit a metal layer and visualize the metal layer, the metal layer, for example, is a Cr and Cu alloy, the visualized metal layer allows the first polycrystalline silicon layer, the second polycrystalline silicon layer, the third polycrystalline silicon layer to form conductive contact points on the upper surface of the device, i.e., the extraction electrode 115 corresponding to the first vibrating diaphragm 104, the extraction electrode 116 corresponding to the second vibrating diaphragm 106, the extraction electrode 117 corresponding to the back plate structure 105, as shown in FIG. 4V;

Step 5, form the back cavity

Figure 4W:
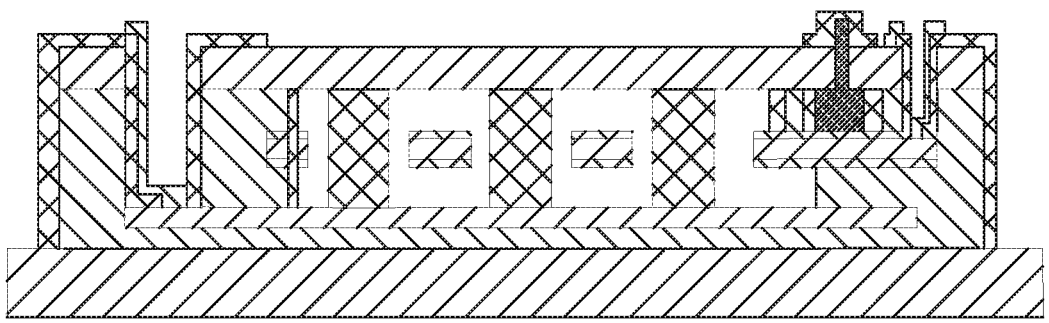
Figure 4X:
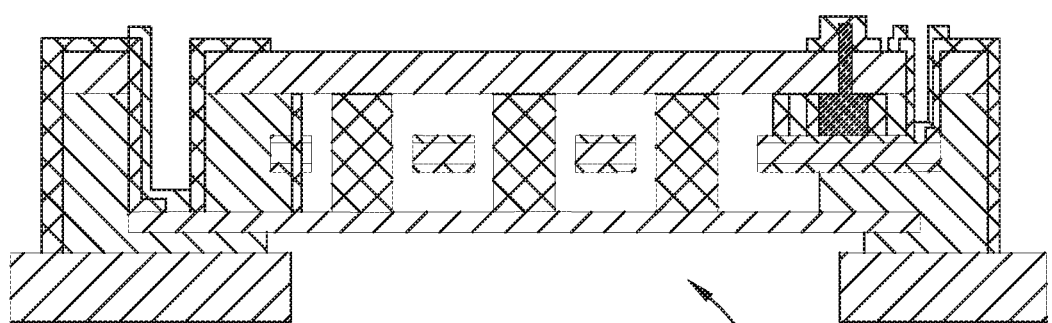

Specifically, it comprises the following steps:

S51, thin the base back, for example, using grinding process to thin the back of the base 101, as shown in FIG. 4W;

S52, visualize the second surface 101B of the base and etch it to form a back cavity area 102, and the etching stops at the first oxidation layer 107A;

S53, eliminate the first oxidation layer 107A in the back cavity area, thus finishing the manufacturing of MEMS microphone, as shown in FIG. 4X.

Preferably, it also comprises the step of forming a through hole 119 of the supporting part through the central area of the device, to form the MEMS microphone as shown in FIG. 2.

Preferably, it also comprises the step of forming an anti-adhesion bump 120 on the upper and lower surfaces of the back plate.

In the method for manufacturing the MEMS microphone in the invention, by forming a releasing hole of the sacrifice layer on the surface layer, eliminate the sacrifice layer of the dual-diaphragm internal cavity, the dual-diaphragm internal cavity of the invention has a pressure intensity consistent with that of the external environment, besides, as prepared with standard semiconductor process, it's easy to integrate with other semiconductor device.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A method for manufacturing a MEMS microphone, comprising steps of:
   selecting a base, depositing a first oxidation layer on the first layer of the base;
   depositing a first polycrystalline silicon layer on the surface of the first oxidation layer and visualizing the first polycrystalline silicon layer to form a first vibrating diaphragm structure;
   depositing a second oxidation layer on the surface of the first vibrating diaphragm structure,
   depositing a material layer of back plate on the surface of the second oxidation layer,
   visualizing the material layer of back plate to form a back plate structure, wherein the back plate structure comprises a central main body area and a first edge area and a second edge area located on the two sides of the central main body area, multiple acoustic through holes are formed in the central main body area of the back plate structure, a first deposition groove for barrier dielectric releasing is formed in the first edge area;

depositing a third oxidation layer on the back plate structure, and flattening the third oxidation layer;

visualizing the third oxidation layer and the second oxidation layer, forming a deposition hole of supporting part between the acoustic through holes, wherein the deposition hole of supporting part is exposed from the first vibrating diaphragm structure, correspondingly the third oxidation layer and the second oxidation layer in the first deposition groove for barrier dielectric releasing are eliminated;

visualizing a part of the third oxidation layer located in the second edge area, and form at least two second deposition grooves for barrier dielectric releasing;

depositing the material layer of supporting part until it fills up the deposition hole of supporting part, the first and the second deposition grooves for barrier dielectric releasing;

flattening the material layer of supporting part until the surface of the third oxidation layer is exposed;

depositing a second material layers of vibrating diaphragm, and visualizing the second vibrating diaphragm material layer to form a releasing hole which is located between any two second layers for barrier dielectric releasing;

eliminating the first vibrating diaphragm structure and the second and the third oxidation layers between the first vibrating diaphragm structure and the second vibrating diaphragm structure, which are corresponding to the central main body area of the back plate structure;

sealing the releasing hole;

preparing the extraction electrodes of the first vibrating diaphragm structure, the second vibrating diaphragm structure and the back plate structure;

back-etching the base to form a back cavity area corresponding to the central main body area of the back plate structure.

2. The method for manufacturing the MEMS microphone as described in claim 1, wherein the step of the depositing of the material layer of back plate comprises a step of depositing a first nitride silicon layer, a second polycrystalline silicon layer and a second nitride silicon layer.

3. The method for manufacturing the MEMS microphone as described in claim 1, wherein the step of depositing of the extraction electrodes of the first vibrating diaphragm structure, the second vibrating diaphragm structure and the back plate structure comprises steps of:

etching to form electrode extraction holes of the first vibrating diaphragm structure, the back plate structure and the second vibrating diaphragm structure;

depositing and visualize the electrode layer, form the first extraction electrode of the first vibrating diaphragm structure, the second extraction electrode of the second vibrating diaphragm structure, the third extraction electrode of the back plate structure.

4. The method for manufacturing the MEMS microphone as described in claim 1, wherein the step of depositing the material layer of supporting part is depositing a third nitride silicon layer on the visualized third oxidation layer.

5. The method for manufacturing the MEMS microphone as described in claim 1, wherein the forming of a back cavity structure comprises:

thinning and etching the base from the second surface of the base;

eliminating the first oxidation layer under the first vibrating diaphragm structure and corresponding to the back cavity structure.

6. The method for manufacturing the MEMS microphone as described in claim 3, further including a step of depositing a passivation protective layer after forming the electrode extraction hole.

7. The method for manufacturing the MEMS microphone as described in claim 6, wherein the electrode layer comprises a Cr/Au layer.

8. The method for manufacturing the MEMS microphone as described in claim 1, further comprising a step of forming a through hole through the supporting part, the through hole communicating the back cavity and the external environment.

9. The method for manufacturing the MEMS microphone as described in claim 1, further including a step of forming a bump on the upper and lower surfaces of the central main body area of the back plate structure.

* * * * *